(12) United States Patent
Chou

(10) Patent No.: US 7,847,720 B2
(45) Date of Patent: Dec. 7, 2010

(54) PIPELINED ANALOG-TO-DIGITAL CONVERTER

(75) Inventor: Yu-Kai Chou, Kaohsiung (TW)

(73) Assignee: Mediatek Inc., Hsin-Chu (TW)

( * ) Notice: Subject to any disclaimer, the term of this patent is extended or adjusted under 35 U.S.C. 154(b) by 42 days.

(21) Appl. No.: 12/354,955

(22) Filed: Jan. 16, 2009

(65) Prior Publication Data

US 2010/0182179 A1  Jul. 22, 2010

(51) Int. Cl.
*H03M 1/34* (2006.01)

(52) U.S. Cl. ........................ 341/162; 341/161

(58) Field of Classification Search .......... 341/161–162
See application file for complete search history.

(56) References Cited

U.S. PATENT DOCUMENTS

| | | | | |
|---|---|---|---|---|
| 5,574,457 A * | 11/1996 | Garrity et al. | ............... | 341/172 |
| 6,756,928 B2 * | 6/2004 | Kawahito et al. | ........... | 341/150 |
| 6,967,610 B1 * | 11/2005 | Sutardja et al. | ............. | 341/161 |
| 7,307,572 B2 * | 12/2007 | Garrity et al. | ................ | 341/172 |
| 7,332,941 B2 * | 2/2008 | Ishii | ............................. | 327/96 |
| 7,408,496 B2 * | 8/2008 | Cho | ............................ | 341/161 |
| 7,612,700 B2 * | 11/2009 | Kawahito et al. | ........... | 341/161 |

* cited by examiner

*Primary Examiner*—Khai M Nguyen
(74) *Attorney, Agent, or Firm*—Thomas, Kayden, Horstemeyer & Risley (57) ABSTRACT

A pipelined analog-to-digital converter includes at least one multiplying digital-to-analog converter and at least one sub-ADC. The multiplying digital-to-analog converter includes at least one first capacitor, at least one second capacitor, an amplifier, and a plurality of switches. The amplifier is coupled to the first and the second capacitors. The switches control a connection between the first and the second capacitors according to a first control signal, a second control signal and a digital signal. In a first period, the first capacitor is connected to the second capacitor in parallel. In a second period, the first capacitor is connected to the second capacitor in series. At least one switch among the switches is composed of a transistor. The sub-ADC provides a digital signal according to the first and second control signals.

19 Claims, 11 Drawing Sheets

PIPELINED ANALOG-TO-DIGITAL CONVERTER

BACKGROUND OF THE INVENTION

1. Field of the Invention

The invention relates to a pipelined analog-to-digital converter (ADC), and more particularly to a pipelined analog-to-digital converter comprising a multiplying digital-to-analog converter (MDAC).

2. Description of the Related Art

The analog-to-digital conversion process converts an analog signal, which is most commonly represented as a voltage, into a digital format. Well-known analog-to-digital conversion methods include series, delta-sigma, parallel, and pipelined architecture. Different architectures are suited for different needs.

A series analog-to-digital architecture provides a wide performance range in analog-to-digital conversion, offering low power consumption and low resolution to quantization. A series architecture typically quantizes analog data at the rate of one bit per cycle. Therefore, a digital sample having N bits of resolution will take N cycles to complete quantization.

A delta-sigma analog-to-digital architecture is often used in audio signal processing. The architecture is designed to translate high-speed, low-resolution samples into higher-resolution, lower-speed outputs. This process is also referred to as oversampling because more samples of the analog data are quantized than actually outputted.

By contrast, a parallel analog-to-digital architecture provides the fastest quantization rate per analog signal. For a parallel (or "flash") architecture, a digital value per cycle is produced for each analog data sample, without regard to N, the number of bits of resolution. A parallel architecture requires that all quantization levels be simultaneously compared to the analog signal. This results in the use of $2^{(N-1)}$ comparators and $2^{(N+1)}$ resistors to achieve a digital value, with N bits of resolution, per cycle. For higher resolution, the circuit complexity of the flash analog-to-digital converter will greatly increase.

Pipelined analog-to-digital architecture, like series analog-to-digital architecture, is a method of quantizing an analog signal in stages. Algorithms exist for obtaining either 1 or 1.5 bits of resolution per stage. In a 1.5-bit per stage converter, the digital output Di of each stage is either 1, 0, or −1. In a 1-bit per stage converter, the digital output of each stage is either 1 or −1 (or 1 or 0). For either algorithm, N stages are used for an N-bit digital value. For resolution of a following bit, one bit is first resolved at each stage, and a residual analog signal sample is transmitted to the following stage for resolution of another bit.

BRIEF SUMMARY OF THE INVENTION

Pipelined analog-to-digital converters are provided. An exemplary embodiment of a pipelined analog-to-digital converter comprises at least one multiplying digital-to-analog converter and at least one sub-ADC. The multiplying digital-to-analog converter comprises at least one first capacitor, at least one second capacitor, an amplifier, and a plurality of switches. The amplifier is coupled to the first and the second capacitors. The switches control a connection between the first and the second capacitors according to a first control signal, a second control signal and a digital signal. In a first period, the first capacitor is connected to the second capacitor in parallel. In a second period, the first capacitor is connected to the second capacitor in series. A first switch among the switches is composed of a first transistor. The sub-ADC provides a digital signal according to the first and the second control signals.

BRIEF DESCRIPTION OF THE DRAWINGS

The invention can be more fully understood by referring to the following detailed description and examples with references made to the accompanying drawings, wherein:

FIGS. 7a and 7b are diagrams of exemplary embodiments of the reference voltage shown in FIG. 5a.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
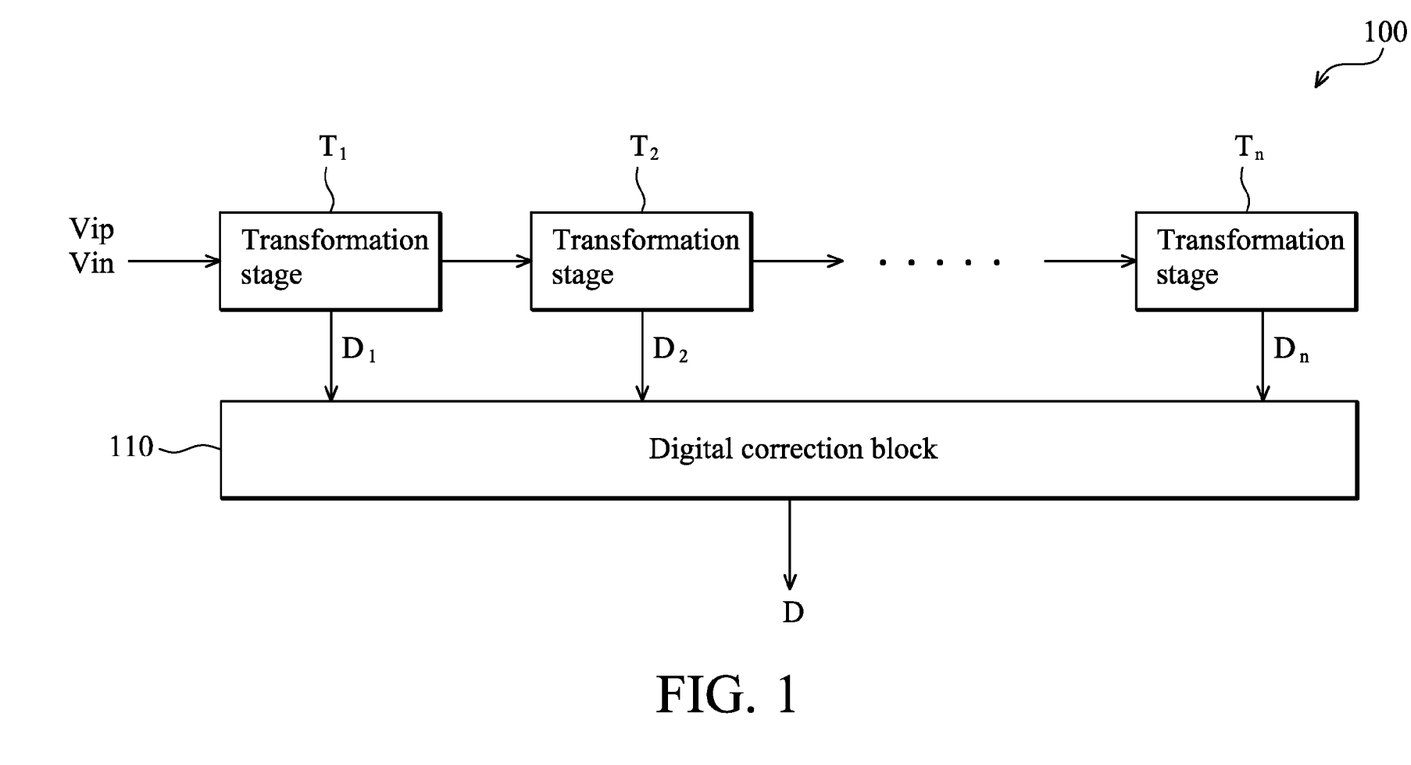
FIG. 1 is a schematic diagram of an exemplary embodiment of a pipelined analog-to-digital converter.

FIG. 1 is a schematic diagram of an exemplary embodiment of a pipelined analog-to-digital converter. Pipelined analog-to-digital converter (ADC) 100 comprises transformation stages $T_1$~$T_n$ and a digital correction block 110. Transformation stages $T_1$~$T_n$ transform an analog signal comprising differential signals Vip and Vin into digital signals $D_1$~$D_n$ respectively (note that the input signal Vin is a positive signal). Digital signals $D_1$~$D_n$ form a digital format of the analog signal, wherein $D_1$ represents the most significant bit, and $D_n$ represents the least significant bit. The digital signals $D_1$~$D_n$ are then time-aligned and digitally corrected by the digital correction block 110. Since the operations of transformation stages $T_1$~$T_n$ are similar, only transformation stage $T_1$ is given as an example.

Figure 2:
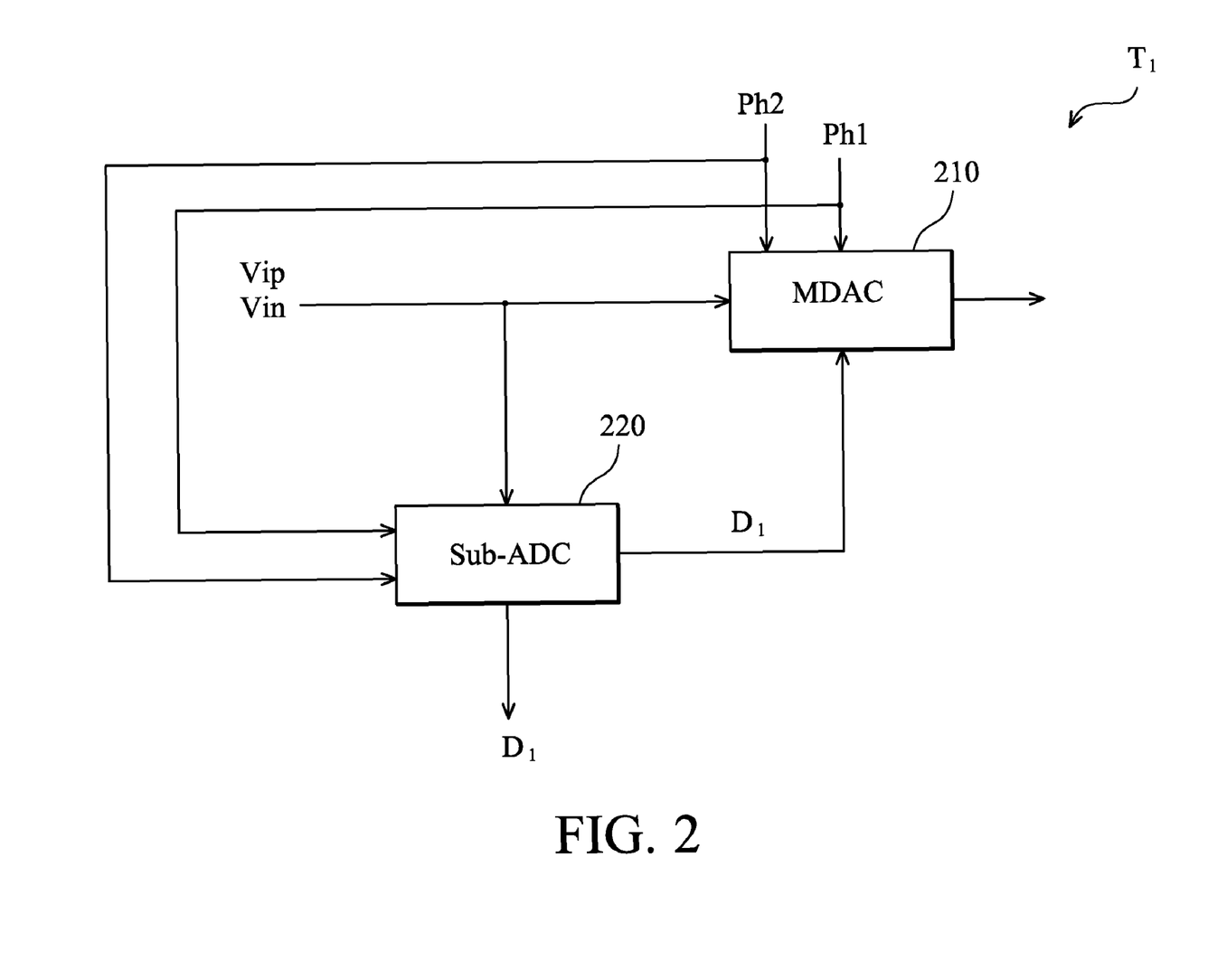
FIG. 2 is a schematic diagram of an exemplary embodiment of the transformation stage.

FIG. 2 is a schematic diagram of an exemplary embodiment of a transformation stage. Transformation stage $T_1$ comprises a multiplying digital-to-analog converter (MDAC) 210 and a sub-ADC 220. MDAC 210 processes differential input signals Vin and Vip according to a digital signal $D_1$ and control signals Ph1 and Ph2. Then, MDAC 210 transmits the processed result to transformation stage $T_2$. Sub-ADC 220 transforms input signals Vin and Vip according to the control signals Ph1 and Ph2, thus, the digital signal $D_1$ is generated.

Figure 3A:
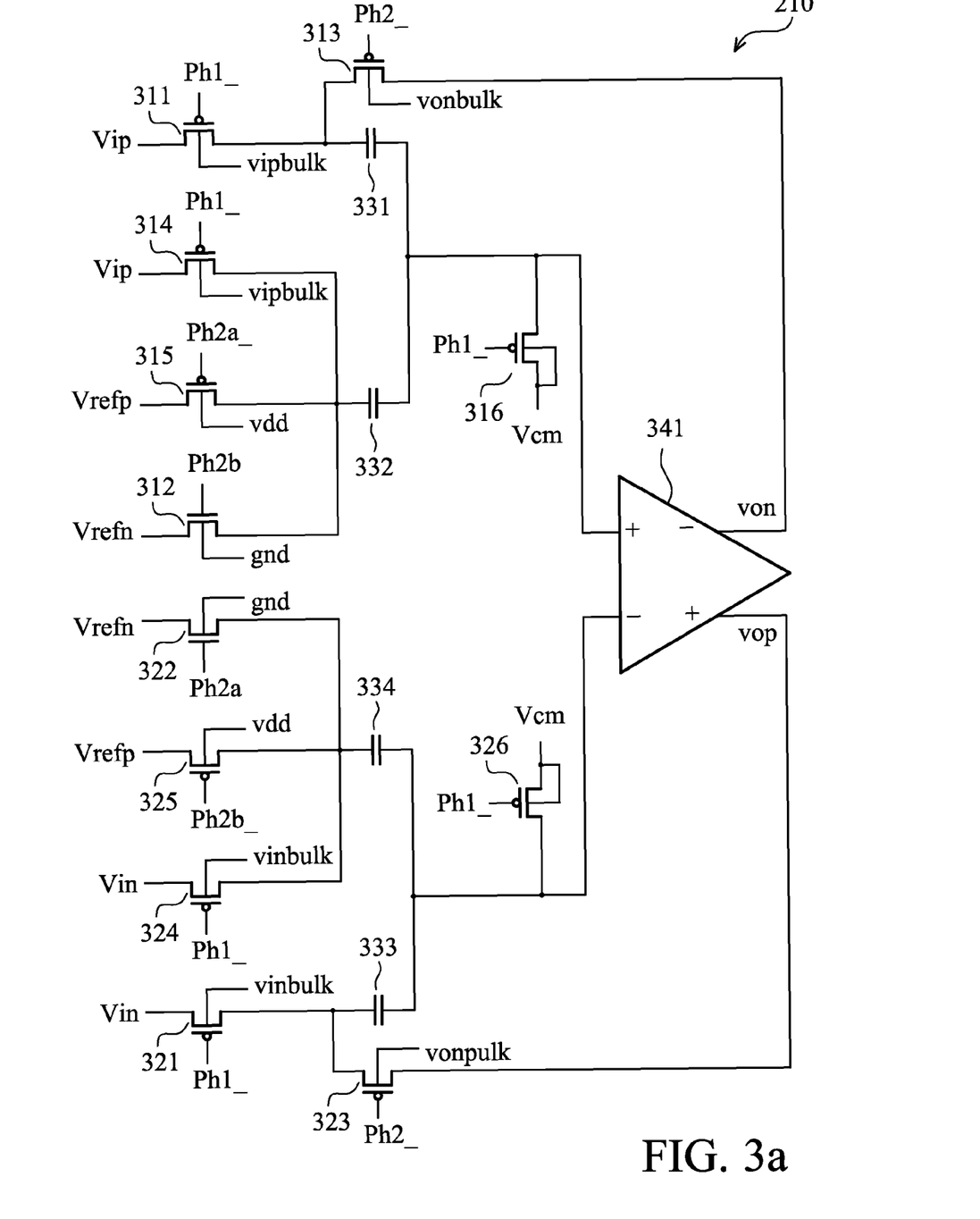
FIG. 3a is a schematic diagram of an exemplary embodiment of the multiplying digital-to-analog converter.

FIG. 3a is a schematic diagram of an exemplary embodiment of the multiplying digital-to-analog converter. MDAC 210 comprises switches 311~316, 321~326, capacitors 331~334, and an amplifier 341. Since the connection between switches 311~316 and capacitors 331 and 332 is similar to the connection between switches 321~326 and capacitors 333 and 334, only the connection between switches 311~316 and capacitors 331 and 332 is given as an example. Note that although twelve switches and four capacitors are shown in this embodiment for illustrative purposes, the numbers and the arrangements of the switches and the capacitors are not limited. In fact, the numbers and the arrangements of the switches and the capacitors can be designed according to the desired performance of the pipelined ADC 100.

Figure 3B:
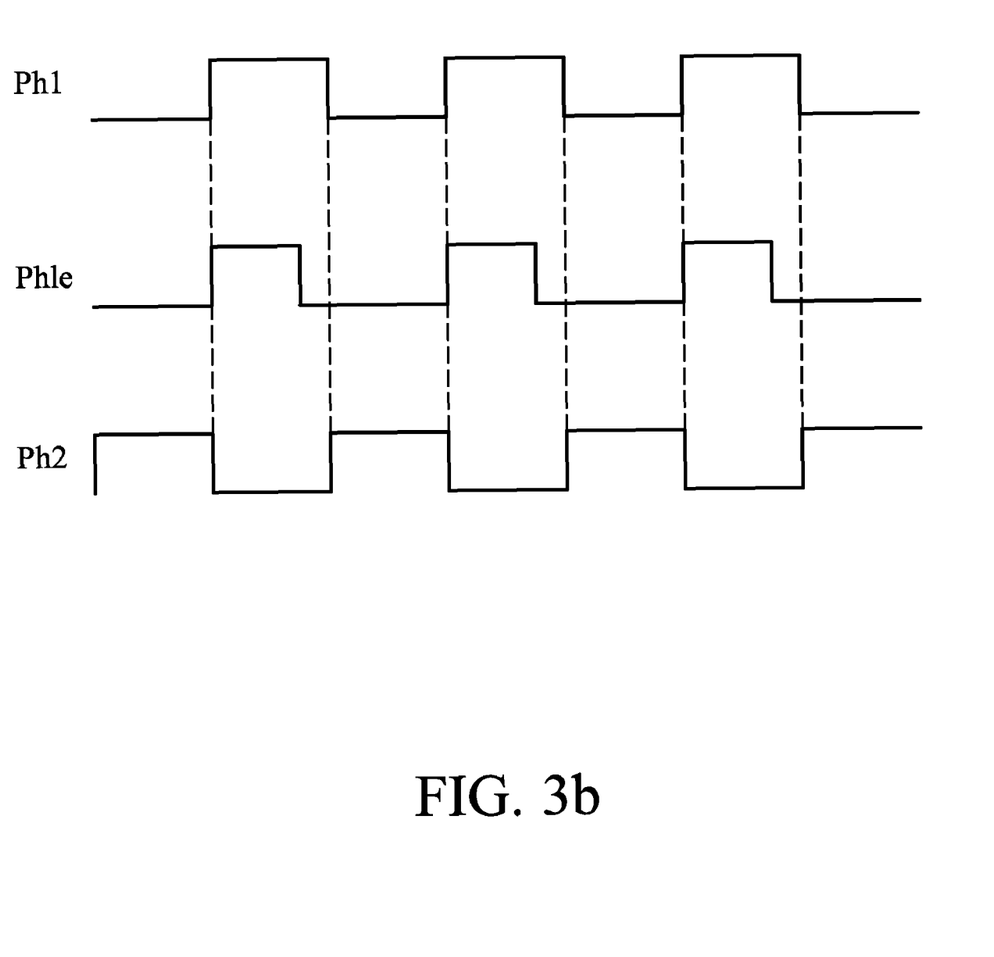
FIG. 3b is a diagram of an exemplary embodiment of the control signals Ph1, Ph2 and Ph1e.

Referring to FIG. 3a, switches 311~316 control the connection between capacitors 331 and 332 according to control signals Ph1 and Ph2 and digital signal $D_1$. In this embodiment, control signals Ph1 and Ph2 are both clock signals and are not overlapped, as shown in FIG. 3b. Control signals Ph1 and Ph1_ are inverse. Control signals Ph2 and Ph2_ are inverse. In one embodiment that transformation stage $T_1$ generates one-bit output, digital signal $D_1$ is logic '0' or logic '1'. The signals Ph2a and Ph2b relate to the digital signal $D_1$. Similarly, signals Ph2a and Ph2a_ are inverse. Signals Ph2b and Ph2b_ are inverse.

In a first period while the Ph1 signal is in a high voltage level and the Ph2 signal is in a low voltage level, switches 311, 314, and 316 are turned on and switches 312, 313, and 315 are turned off according to signals Ph1_, Ph2_, Ph2a_, and Ph2b. Thus, capacitors 331 and 332 are connected in parallel between input signal Vip and voltage Vcm for sampling input signal Vip. In this embodiment, switches 311 and 314 are respectively implemented by PMOS transistors. Therefore, capacitor 331 receives input signal Vip through only one transistor. Similarly, capacitor 332 receives input signal Vip through one transistor only.

In a second period while the Ph2 signal is in a high voltage level and the Ph1 signal is in a low voltage level, switch 313 and switches 312 or 315 are turned on and switches 311, 314, and 316 are turned off such that capacitors 331 and 332 are connected in series between reference signal Vrefp or Vrefn and the negative output terminal of amplifier 341. The switches 312 and 315 are controlled by the signals Ph2b and Ph2a_, respectively. Since the signals Ph2b and Ph2a_ relate to the digital signal $D_1$, each of the switches 312 and 315 is turned on or off according to the digital signal $D_1$. For example, assuming switches 313 and 315 are turned on such that capacitors 331 and 332 are connected in series between reference signal Vrefp and the negative output terminal of amplifier 341, amplifier 341 amplifies the difference between the reference signal Vrefp and the sampled result stored in capacitors 331 and 332. In this embodiment, capacitor 332 only utilizes a transistor of switch 312 or utilizes a transistor of switch 315 to receive reference signal Vrefp or Vrefn, wherein the transistor of switch 312 is a NMOS transistor and transistor of switch 315 is a PMOS transistor. Reference signals Vrefp and Vrefn have different voltage levels.

Moreover, the control signals inputted to the switches 311 and 316 are not limited to have exactly the same waveform. For example, the switch 311 can be controlled by the control signal Ph1_, while the switch 316 is controlled by another control signal Ph1e_. The relationship between the control signals Ph1 and Ph1e is shown in FIG. 3b. As can be seen, the rising edges of the control signals Ph1 and Ph1e are synchronous, but the control signal Ph1e falls earlier than the control signal Ph1. Similarly, the control signals inputted to the switches 321 and 326 are not limited to have exactly the same waveform. The switch 321 can be controlled by the control signal Ph1_, while the switch 326 is controlled by the control signal Ph1e_.

Figure 3C:
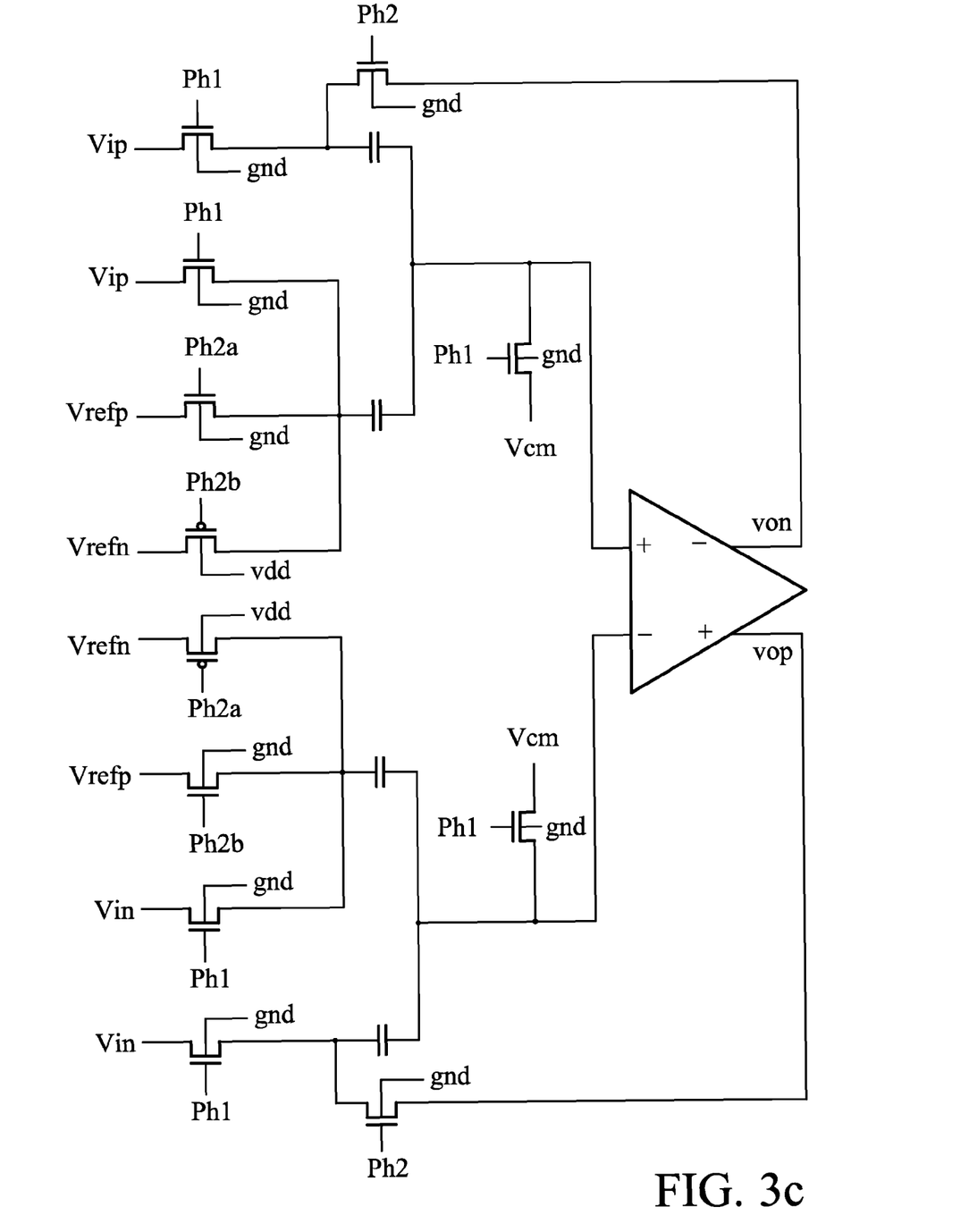
FIG. 3c is a schematic diagram of another exemplary embodiment of the multiplying digital-to-analog converter.

One of the switches 311~316 is composed of a transistor, e.g. a PMOS transistor or a NMOS transistor. In this embodiment, switches 312 and 322 are N-type transistors and the others are P-type transistors. In one embodiment (shown in FIG. 3c), switches 312 and 322 are P-type transistors and the others are N-type transistors.

Referring to FIG. 3a, when the transistors of switches 311 and 314 are P-type, the well of the transistors are configured to receive voltage vipbulk, which will be further described in the following paragraphs. The transistor of switch 315 comprises a well receiving a power signal vdd. The transistor of switch 312 comprises a substrate receiving a ground signal gnd. The transistor of switch 313 comprises a well receiving voltage vonbulk, which will be further described in the following paragraphs. The transistor of switch 316 comprises a well receiving voltage Vcm. The voltage Vcm has a voltage level between the reference volateg levels Vrefp and Vrefn. In some embodiments, the well of transistors of switches 311, and 313~316 can be configured to receive power signal vdd.

Figure 4A:
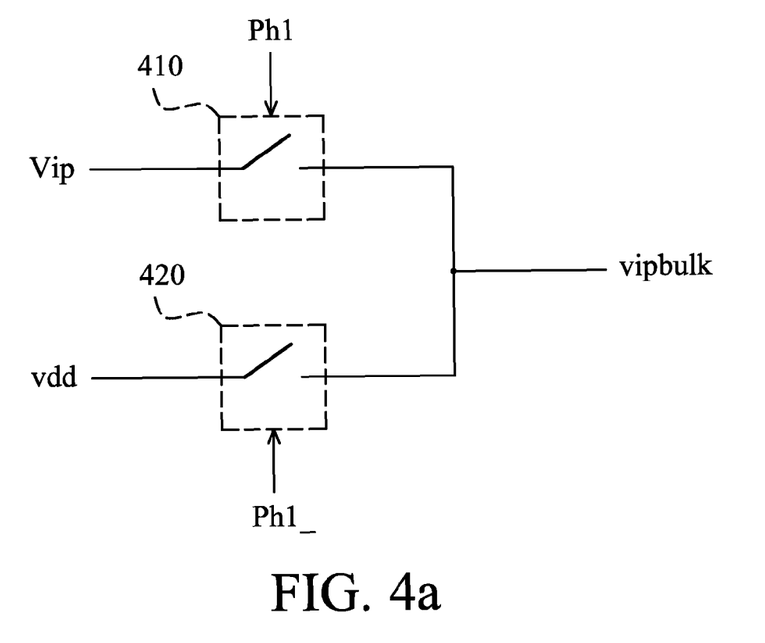
FIGS. 4a~4d show the relationship between the voltage and control signal.
Figure 4B:
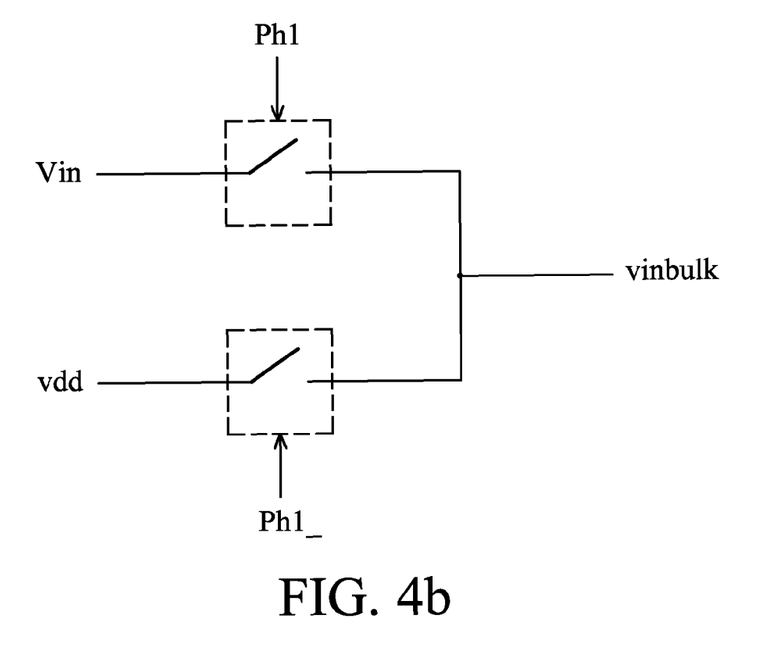
Figure 4C:
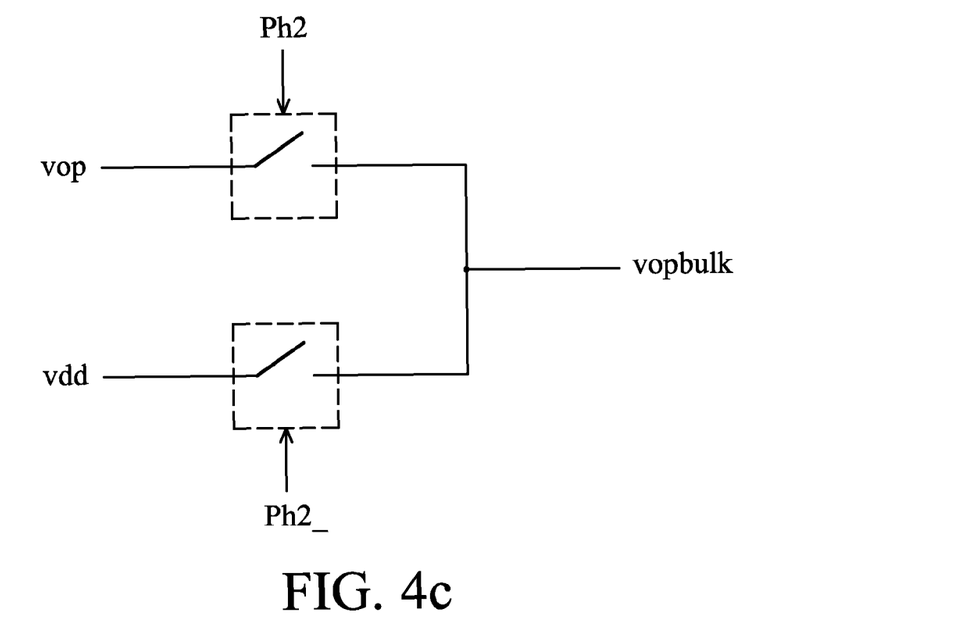
Figure 4D:
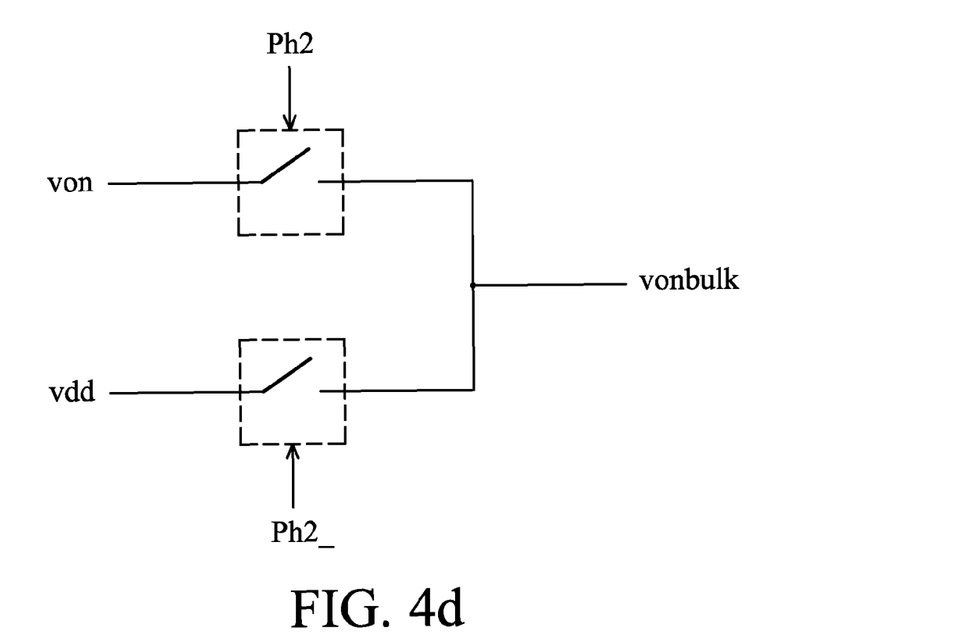

FIGS. 4a~4d show the relationship between the voltage and control signal. Referring to FIG. 4a, switch 410 provides input signal Vip to serve as the voltage vipbulk according to signal Ph1. Switch 420 provides power signal vdd to serve as the voltage vipbulk according to signal Ph1_. Since FIGS. 4a~4d have the same principle, descriptions of FIGS. 4b~4d are omitted for brevity. Additionally, voltages vop and von shown in FIGS. 4c and 4d, respectively represent a positive output signal and a negative output signal provided by amplifier 341.

Figure 5A:
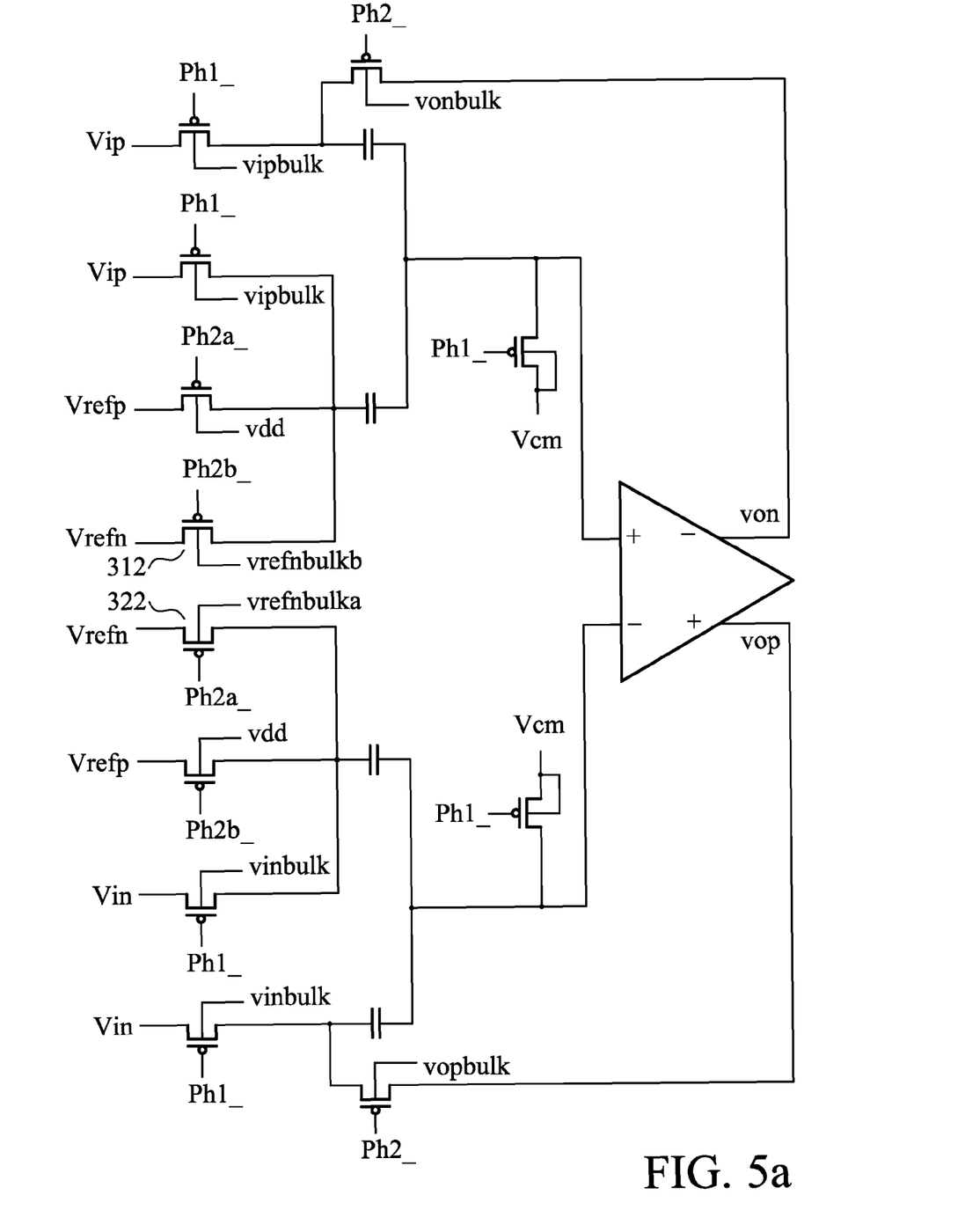
FIGS. 5a, 5b and 6 are schematic diagrams of other exemplary embodiments of the multiplying digital-to-analog converter.
Figure 7A:
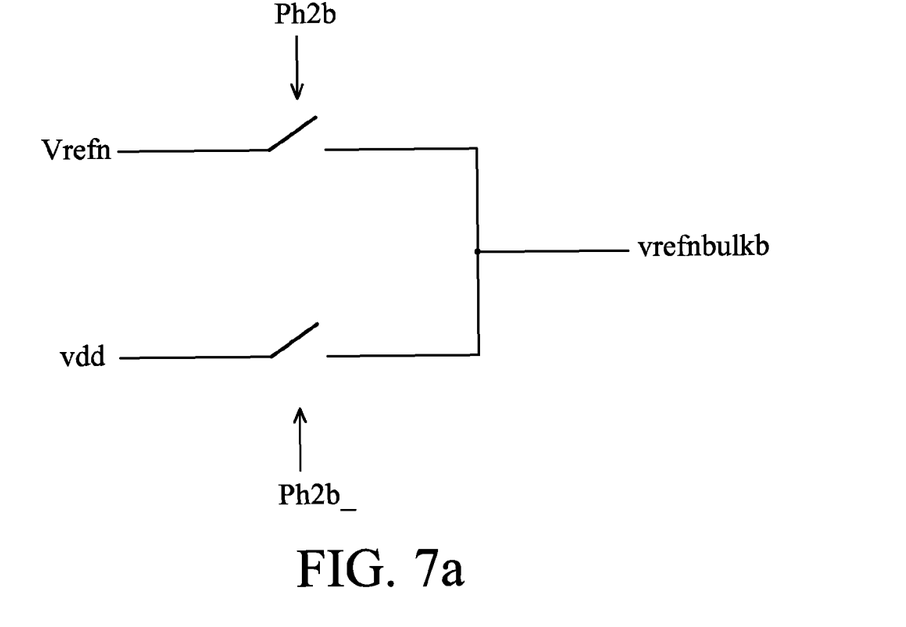
Figure 7B:
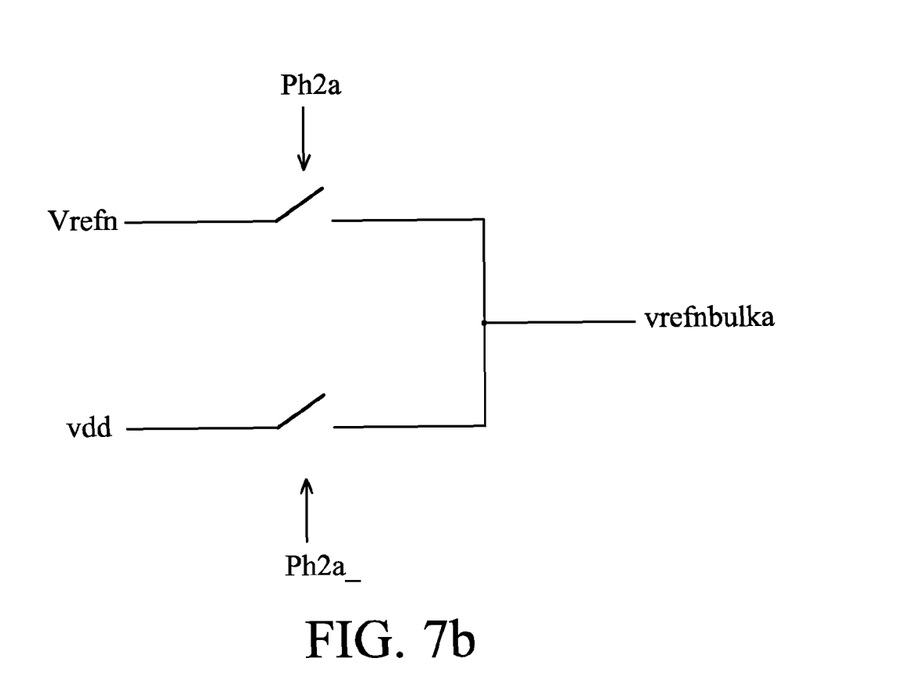

FIG. 5a is a schematic diagram of another exemplary embodiment of the multiplying digital-to-analog converter. FIG. 5a is similar to FIG. 3a with the exception that switches 312 and 322 are composed of P-type transistors and the wells of the switches 312 and 322 receive voltage vrefnbulkb and vrefnbulka, respectively. The transistor of switch 312 comprises a well receiving voltage vrefnbulkb. The transistor of switch 322 comprises a well receiving voltage vrefnbulka. As shown in FIG. 7a, reference signal Vrefn and the power signal vdd serve as the voltage vrefnbulkb alternately according to the control signals Ph2b and Ph2b_. As shown in FIG. 7b, reference signal Vrefn and the power signal vdd serve as the voltage vrefnbulka alternately according to the control signals Ph2a and Ph2a_. However, in another embodiment, the voltage vrefnbulkb and vrefnbulka can be replaced by the power signal vdd. In other words, the wells of the transistors of the switches 312 and 322 receive the power signal vdd.

Figure 5B:
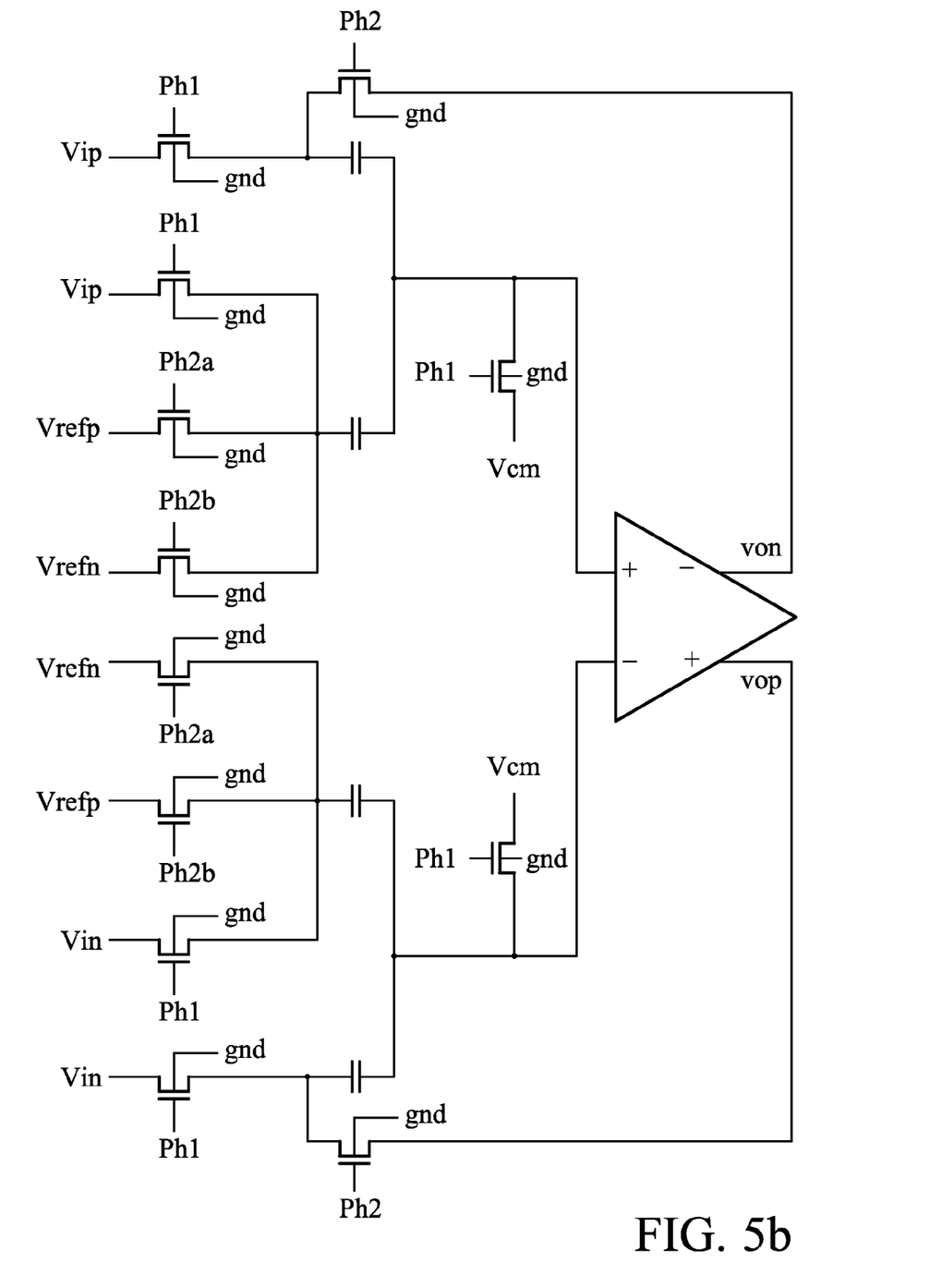

In FIG. 5a, all switches are implemented by PMOS transistors. FIG. 5b is a schematic diagram of another exemplary embodiment of the multiplying digital-to-analog converter. FIG. 5b is similar to FIG. 5a with the exception that all switches are implemented by NMOS transistors. The substrates of N-type transistors receive ground signal gnd.

In this embodiment, because the digital signal $D_1$ provided by sub-ADC 220 comprises two states (0 and 1), the connection between switches 311~316 and capacitors 331 and 332 is shown as FIG. 3a. If the digital signal $D_1$ comprises seven state (000~110), the structure of MDAC is shown as FIG. 6. Modules 610~680 of MDAC 600 are coupled between a positive input terminal and a negative output terminal of an amplifier 691. The structures of Modules 610 and 620 are the same. The structures of Modules 630~680 are the same. The transistors receiving reference signal Vrefp or Vrefn comprise gates receiving digital signals provided by sub-ADC. For brevity, the modules coupled between a negative input terminal and a positive output terminal of amplifier 691 is omitted.

Figure 6:
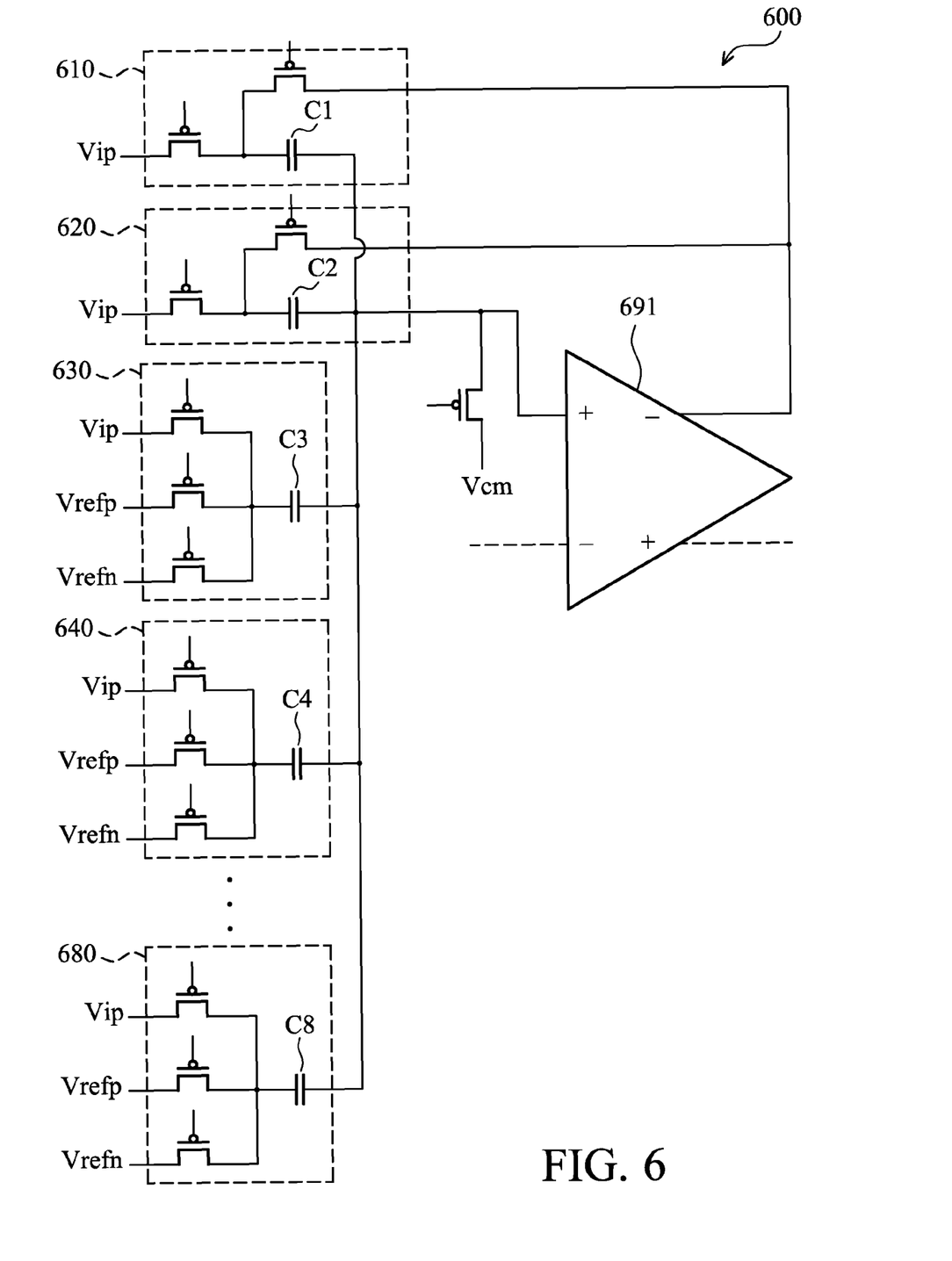

The connection between capacitors C1~C8 is controlled according to transistors. In a first period (e.g. when the control signal Ph1 is in the high voltage level), capacitors C1~C8 are connected in parallel between an input signal Vip and voltage Vcm for sampling input signal Vip. In a second period (e.g. when the control signal Ph2 is in the high voltage level), capacitors C1 and C2 are connected in parallel. Capacitors C3~C8 are connected in parallel and then connected to capacitor C1 in series between reference signal Vrefp or Vrefn and the negative output terminal of amplifier 691.

By utilizing PMOS or NMOS transistors to implement the switches, the power consumption of the pipelined ADC 100 can be reduced and the clock distribution of the circuit can be simplified significantly.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pipelined analog-to-digital converter, comprising:
at least one multiplying digital-to-analog converter comprising:
at least one first capacitor;
at least one second capacitor;
an amplifier coupled to the first and the second capacitors;
a plurality of switches for controlling a connection between the first and the second capacitors according to a first control signal, a second control signal and a digital signal, wherein in a first period, the first capacitor is connected to the second capacitor in parallel, and in a second period, the first capacitor is connected to the second capacitor in series, and a first switch among the switches is composed of a first transistor; and
at least one sub-ADC for providing a digital signal according to the first and second control signals, wherein a well of the first transistor receives an input signal of the multiplying digital-to-analog converter and a power signal alternately.

2. The pipelined analog-to-digital converter as claimed in claim 1, wherein the first transistor is composed of a PMOS transistor.

3. The pipelined analog-to-digital converter as claimed in claim 2, wherein a second switch among the switches is composed of a second transistor different from the PMOS transistor.

4. The pipelined analog-to-digital converter as claimed in claim 1, wherein the first transistor is composed of a NMOS transistor.

5. The pipelined analog-to-digital converter as claimed in claim 4, wherein a second switch among the switches is composed of a second transistor different from the NMOS transistor.

6. The pipelined analog-to-digital converter as claimed in claim 1, wherein each of the switches is composed of one transistor.

7. The pipelined analog-to-digital converter as claimed in claim 6, wherein each of the switches is composed of a PMOS transistor.

8. The pipelined analog-to-digital converter as claimed in claim 6, wherein each of the switches is composed of a NMOS transistor.

9. The pipelined analog-to-digital converter as claimed in claim 1, wherein the first switch is coupled between the first capacitor and an input signal, and a second switch among the switches is composed of a second transistor.

10. The pipelined analog-to-digital converter as claimed in claim 9, wherein a third switch among the switches is coupled between the first capacitor and the amplifier, a fourth switch among the switches is coupled between the input signal and the second capacitor, a fifth switch among the switches is coupled between a first reference signal and the second capacitor, a sixth switch among the switches is composed of a sixth transistor coupled to the first capacitor, the second switch is coupled between a second reference signal and the second capacitor, and the first and the second reference signals have different voltage level.

11. The pipelined analog-to-digital converter as claimed in claim 10, wherein each of the third, the fourth, the fifth, and the sixth switches is composed of a PMOS transistor and the second switch is a NMOS transistor.

12. The pipelined analog-to-digital converter as claimed in claim 11, wherein a well of the fourth switch receives an input signal of the multiplying digital-to-analog converter and a first power signal alternately.

13. The pipelined analog-to-digital converter as claimed in claim 11, wherein a well of the third switch receives an output signal of the amplifier and a first power signal alternately.

14. The pipelined analog-to-digital converter as claimed in claim 11, wherein a well of the fifth switch receives a first power signal, and a substrate of the second switch receives a second power signal different from the first power signal.

15. The pipelined analog-to-digital converter as claimed in claim 10, wherein a well of the sixth transistor receives a signal whose amplitude is between voltage levels of the first and the second reference signals.

16. A pipelined analog-to-digital converter, comprising:
at least one multiplying digital-to-analog converter comprising:
at least one first capacitor;
at least one second capacitor;
an amplifier coupled to the first and the second capacitors; and
a plurality of switches for controlling a connection between the first and the second capacitors according to a first control signal, a second control signal and a digital signal, wherein in a first period, the first capacitor is connected to the second capacitor in parallel, and in a second period, the first capacitor is connected to the second capacitor in series, and a first switch among the switches comprises a first transistor; and
at least one sub-ADC for providing a digital signal according to the first and second control signals;
wherein a well of the first transistor receives an output signal of the amplifier and a power signal alternately.

17. The pipelined analog-to-digital converter as claimed in claim 16, wherein a second switch among the switches is coupled between the first capacitor and an input signal, a third switch among the switches is coupled between the input signal and the second capacitor, a fourth switch among the switches is coupled between a first reference signal and the second capacitor, and a fifth switch among the switches is coupled to the first capacitor.

18. The pipelined analog-to-digital converter as claimed in claim 17, wherein each of the first, the second, the third, the fourth, and the fifth switches is composed of a PMOS transistor.

19. A pipelined analog-to-digital converter, comprising:
at least one multiplying digital-to-analog converter, comprising:
at least one first capacitor;
at least one second capacitor;
an amplifier coupled to the first and the second capacitors; and
a plurality of switches for controlling a connection between the first and the second capacitors according to a first control signal, a second control signal and a digital signal, wherein in a first period, the first capacitor is connected to the second capacitor in parallel, and in a second period, the first capacitor is connected to the second capacitor in series, and a first switch among the switches comprises a first transistor; and at least one sub-ADC for providing a digital signal according to the first and second control signals;

wherein a well of the first switch receives a reference signal and a power signal alternately.

* * * * *